United States Patent
Darthenay

(10) Patent No.: US 8,830,095 B2
(45) Date of Patent: Sep. 9, 2014

(54) TRACK AND HOLD CIRCUIT AND METHOD

(71) Applicant: NXP B.V., Eindhoven (NL)

(72) Inventor: Frederic Darthenay, Saint Aubin sur Mer (FR)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/770,003

(22) Filed: Feb. 19, 2013

(65) Prior Publication Data

US 2013/0222163 A1    Aug. 29, 2013

(30) Foreign Application Priority Data

Feb. 28, 2012 (EP) .................................... 12290067

(51) Int. Cl.
  *H03M 1/00* (2006.01)
  *G11C 27/02* (2006.01)
  *H03M 1/12* (2006.01)

(52) U.S. Cl.
  CPC ............ *H03M 1/1245* (2013.01); *G11C 27/026* (2013.01); *G11C 27/024* (2013.01)
  USPC ......................................... 341/122; 341/155

(58) Field of Classification Search
  CPC ....................................................... G11C 27/02
  USPC .......................................... 341/155, 122–124
  See application file for complete search history.

(56) References Cited

U.S. PATENT DOCUMENTS

| | | | |
|---|---|---|---|
| 5,650,715 A | 7/1997 | Massie | |
| 7,126,511 B2 * | 10/2006 | Draxelmayr et al. | 341/136 |
| 8,248,282 B2 * | 8/2012 | Payne et al. | 341/123 |
| 8,350,738 B2 * | 1/2013 | Sanduleanu et al. | 341/120 |
| 8,410,968 B2 * | 4/2013 | Johancsik | 341/161 |
| 2001/0052864 A1 | 12/2001 | Shimizu et al. | |
| 2006/0049857 A1 | 3/2006 | Song | |
| 2007/0052452 A1 | 3/2007 | Chou et al. | |

FOREIGN PATENT DOCUMENTS

WO    2005/013284 A1    2/2005

OTHER PUBLICATIONS

Extended European Search Report for European Patent Appln. No. 12290067.3 (Jul. 16, 2012).

* cited by examiner

*Primary Examiner* — Brian Young

(57) ABSTRACT

A track and hold circuit has a main transistor for which the gate voltage is provided by a buffer circuit which is supplied with a different voltage supply than the circuit of the main transistor. This avoids the need for a bootstrap circuit.

14 Claims, 5 Drawing Sheets

TRACK AND HOLD CIRCUIT AND METHOD

CROSS-REFERENCE TO RELATED APPLICATIONS

This application claims the priority under 35 U.S.C. §119 of European patent application no. 12290067.3, filed on Feb. 28, 2012, the contents of which are incorporated by reference herein.

This invention relates to track and hold circuits (also known as sample and hold circuits).

A track and hold circuit is used to track a varying input signal (typically a voltage) and periodically provide a held value on an output terminal. The held value on the output terminal is updated over time, to implement a sampling function. This function is for example used in multiplexer circuits, in which a selected one of a plurality of inputs is presented to the output, and in analogue to digital converters, in which the track and hold function is used to provide a stable output while the conversion takes place.

A track and hold circuit needs to balance requirements for high speed, large bandwidth and linearity. For track and hold circuits built from a MOS transistor operating as a pass gate (such as using CMOS processing), these requirements are generally obtained by maintaining the gate-source voltage of the pass gate constant during the tracking phase relative to the input voltage. The gate voltage can be implemented as the sum of the input voltage (Vin), a fixed voltage step (Vt) and the threshold voltage of the pass gate transistor (Vgt; hence Vg=Vin+Vt+Vgt).

In a first order approximation, neglecting short channel effects (such as velocity saturation) it can be shown that:

$$1/Ron = Kn*(W/L)n*\{Vdd-Vin-(Vthon+Gn*(\sqrt{(2Ob+Vin-Vsub)}-\sqrt{(2Ob)}))\}$$

$$Vgs = Vdd-Vin-(Vthon+Gn*(\sqrt{(2Ob+Vin-Vsub)}-\sqrt{(2Ob)}))$$

where:
Ron=equivalent resistance of the pass gate
(W/L)n=size of the MOS pass gate
Vdd=supply voltage
Vin=input voltage
Vsub=source bulk voltage
Kn+=effective current of the MOS
Vthon=threshold voltage@Vsbulk=0V
Gn=body effect coefficient
Ob=Fermi level
Vgs=Gate-source voltage The above expression shows that the on resistance Ron is modulated with the input signal Vin. For this reason, the linearity can be improved if the gate-source voltage Vgs can be made constant independently of the input signal, as explained above.

FIG. 1 shows the typical known track and hold circuit.

It comprises a MOS transistor 10 in series between the input Vin and output Vout, with the source at the output and the drain at the input. The transistor functions as a pass gate, and will be referred to as the "main transistor".

In the tracking phase, the transistor is turned on, and a fixed gate-source voltage Vgson is applied to the transistor. This is shown in FIG. 1 as a voltage source between the output Vout and the transistor gate. In the track phase, the input and output voltages are equal (for a negligible drain-source voltage), so the voltage is copied from input to output.

The output voltage is used to charge a capacitor 12.

In the hold phase, the transistor is turned off (shown in FIG. 1 by a grounded gate), and the capacitor 12 provides a constant output voltage for the duration of time before the next track phase.

In order to provide low charge injection, low input loading, and good isolation in the hold phase, the pass gate has to be efficient. There is also a minimum size of transistor for a given target value of the on resistance Ron.

To meet the efficiency requirements, the value of Vgson should be as high as possible (to switch the transistor hard on). With a basic implementation, the gate is either connected to Vdd (for the track track phase) or to ground (for the hold phase); so Vgsonmax=Vdd−Vinmax can be very low making the implementation inefficient.

If the supply voltage (Vddcore) is low compared to input signal, the gate voltage (Vg) needs to exceed the supply voltage (Vdd) making the control difficult to implement. However, this is made possible by defining the gate voltage relative to the output (or input) voltage as shown in FIG. 1, i.e. by fixing the gate-source voltage rather than the absolute gate voltage. This is a so-called "bootstrap" approach.

FIG. 2 shows a track and hold circuit using a bootstrapped configuration in more detail.

Many implementations have been developed to provide this bootstrapped operation. Different variations use different numbers of components and in particular the number of bootstrap capacitors (the capacitors used to generate the Vgson voltage).

The example of FIG. 2 uses a bootstrap capacitor 20 and a set of switches to implement the Vgson voltage step used in the circuit of FIG. 1.

In the track phase, the bootstrap capacitor 20 is connected in series between the source and gate. This means the bootstrap capacitor forces the gate voltage to be a fixed amount higher than the output voltage (which is equal to the input voltage).

In the hold phase, the gate of the main transistor 10 is connected to ground (in the same way as in FIG. 1), and the bootstrap capacitor is charged to the supply voltage, but is isolated from the output voltage. Thus, in each cycle, the bootstrap capacitor is recharged to the supply voltage, and this provides a voltage step by which the gate voltage exceeds the input/output voltage.

The bootstrap circuit clearly occupies a significant area, with its storage capacitor and associated switches.

According to the invention, there is provided an apparatus and method as defined in the independent claims.

In one aspect, there is provided a track and hold circuit, comprising:
a main transistor between an input and an output of the circuit, wherein the main transistor is part of an integrated circuit supplied by a first set of voltage rails;
a storage capacitor for storing the output voltage during a hold phase during which the main transistor is turned off;
a buffer circuit for generating a gate voltage for turning on the main transistor during a track phase, wherein the buffer circuit is adapted to derive a gate voltage based on the input or output voltage of the circuit and a voltage step, wherein the buffer circuit is supplied by a second set of voltage rails with a greater voltage swing than the first set of voltage rails.

This circuit makes use of a higher voltage source for a buffer circuit (which generates the gate voltage for the main transistor) than used by the circuit of which the main transistor forms a part. Each set of voltage rails typically comprises ground and at least one high voltage rail, for example in the range of 1V to 2V for the main transistor circuit and more than 2.5V for the buffer circuit.

The main transistor circuit is typically part of a IC, for example a CMOS circuit.

By using a buffer circuit to generate the gate voltage for the main transistor, bootstrap techniques are no longer required.

The buffer circuit can comprise a first, current source transistor, and a second transistor in series between voltage rails of the second set, wherein the node between the first and second transistors controls the gate voltage of the main transistor. The first transistor gate can be connected to a voltage derived from the high voltage rail of the second set and the second transistor gate is connected to the input or output.

The current source transistor generates a current corresponding to the gate-source voltage applied, and this is mirrored to the gate-source of the second transistor. In this way, a voltage step is copied from the current source transistor onto the gate of the main transistor. This step can be larger than the maximum voltage of the first set of voltage rails.

In a first example, the node between the first and second transistors can be connected to gate of the main transistor. A hold transistor between the gate of the main transistor and ground can be used for implementing the hold phase, by shorting the main transistor gate to ground.

In a second example, the node between the first and second transistors is connected to a control transistor gate, and the control transistor is connected between a voltage rail of the second set of voltage rails and the gate of the main transistor. This provides an indirect coupling from the node to the main transistor gate, and it means that the first and second transistors can remain turned on for both phases. This improves transition times and reduces charge injection to the input or output, but at the expense of increased current consumption.

A hold transistor can again be provided between the gate of the main transistor and ground for implementing the hold phase.

A current source can be provided for driving a current through the control transistor. This is used to set the voltage levels in the various transistors in the circuit (in particular gate-source voltages) to achieve the desired gate voltage on the main transistor.

A second hold transistor can be provided between the node and ground and switched synchronously with the hold transistor. This means that the principles underlying the first and second examples are effectively combined. Thus, current consumption during the hold phase (in the second transistor) can be reduced while still enabling good speed of transition between the track and hold phases, as well as low charge injection.

The second set of voltages preferably has a voltage swing at least equal to the sum of a maximum input voltage, the voltage step and the saturation voltage of the first, current source transistor. In this way, a desired maximum input voltage can be tolerated by use of a suitable buffer circuit.

In another aspect, there is provided a method of controlling a track and hold circuit which comprises a main transistor between an input and an output of the circuit and which is part of an integrated circuit supplied by a first set of voltage rails, wherein the method comprises generating a gate voltage for turning on the main transistor during a track phase using a buffer circuit, wherein the buffer circuit is controlled to derive a gate voltage based on the input or output voltage of the circuit and a voltage step, wherein the buffer circuit is supplied by a second set of voltage rails with a greater voltage swing than the first set of voltage rails.

Examples of the invention will now be described in detail with reference to the accompanying drawings, in which.

Figure 6A:
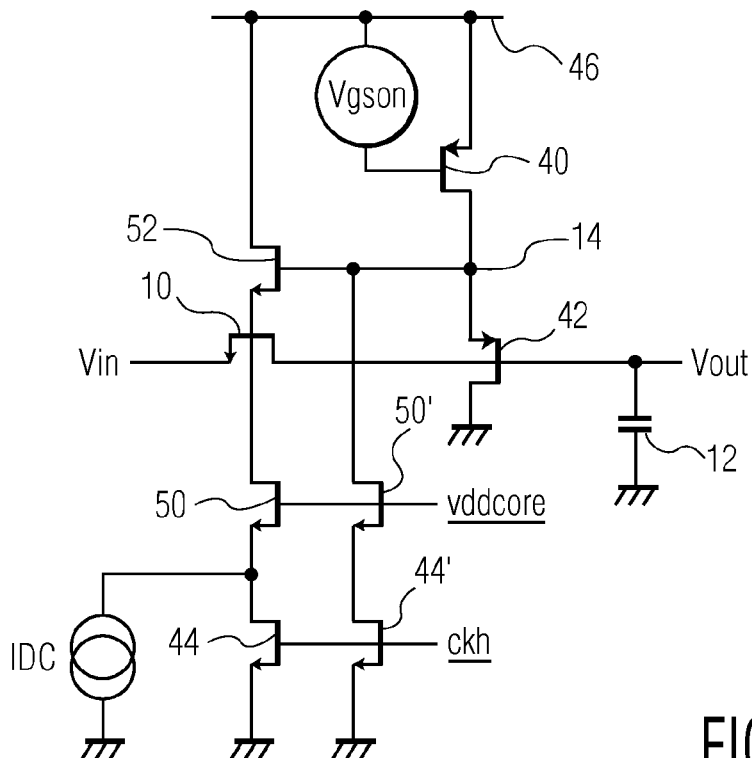
Figure 6B:
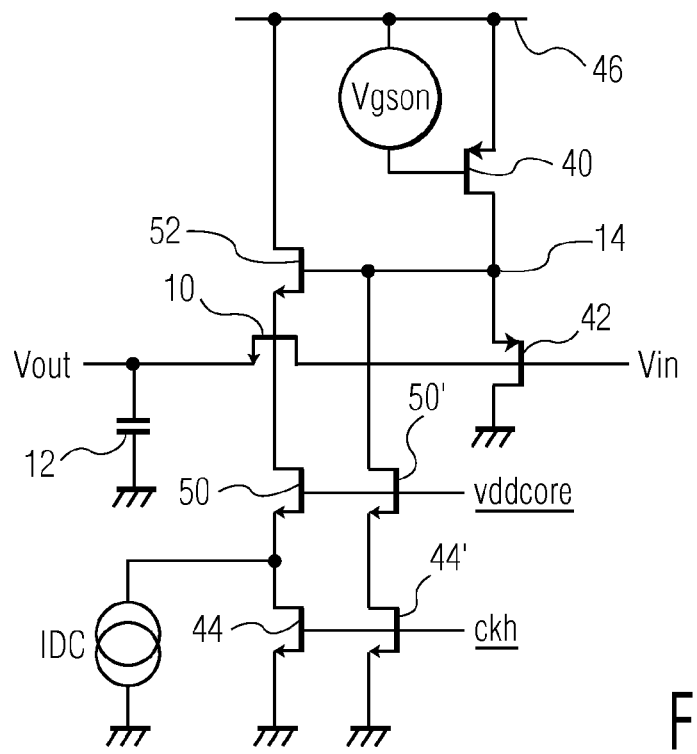
Figure 7A:
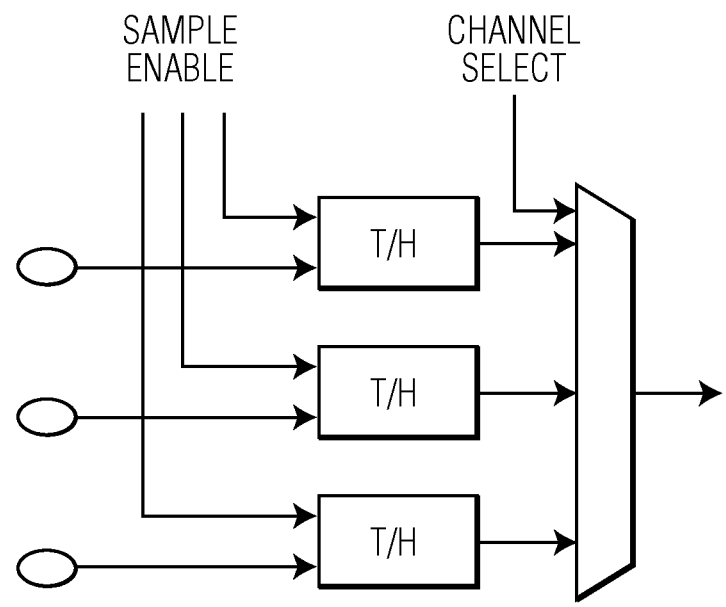
Figure 7B:
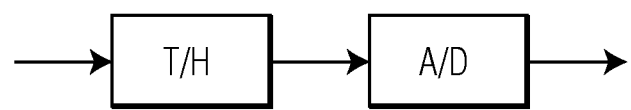

FIG. 6A is a circuit diagram which shows one versions of a track and hold circuit in accordance with a third example of the invention; and FIG. 6B is a circuit diagram which shows another version of a track and hold circuit in accordance with a third example of the invention; and FIG. 7A is a circuit diagram which shows schematically one example circuit which can use the track and hold circuits of the invention; and FIG. 7B is a circuit diagram which shows schematically another example circuit which can use the track and hold circuits of the invention.

The invention provides a track and hold circuit in which the gate voltage of the main (pass gate) transistor is provided by a buffer circuit which is supplied with a different voltage supply than the circuit of the main transistor.

The invention provides an alternative implementation to the well-known bootstrap technique for track and hold or multiplexor circuits, and is particularly suitable when an analog supply is available with a higher voltage than the supply voltage to the digital IC carrying the other track and hold circuit components. Thus, the invention is particularly suitable when an analog supply is available with a voltage greater than the digital core supply. This is often the case with modern technologies whose digital core supply (Vddcore) is very low (such as 1.0V, 1.2V, 1.8V). Input and output circuits use higher voltage supplies for the input and output pads (such as 2.5V, 3.3V).

Using the principles underlying the invention, there is no longer a need for complex, high area bootstrap circuitry to generate, store and transmit the required gate-source (Vgson) voltage for the main transistor. Instead, the gate voltage Vgson can be produced using the buffer which is supplied by the highest available supply.

Figure 1:
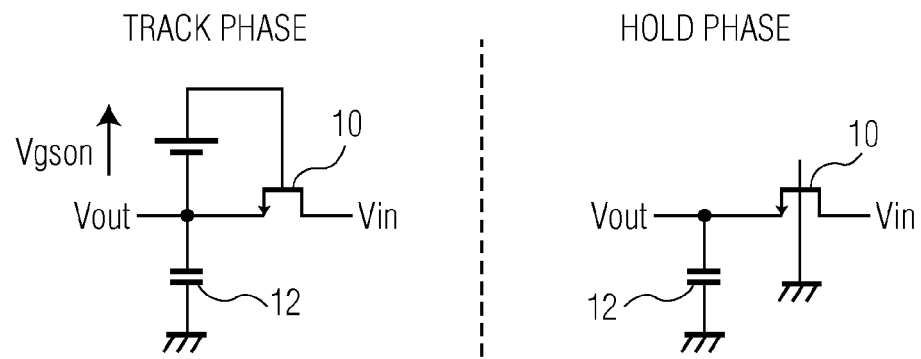
FIG. 1 is a circuit diagram which shows a first known track and hold circuit in simplified form.
Figure 2:
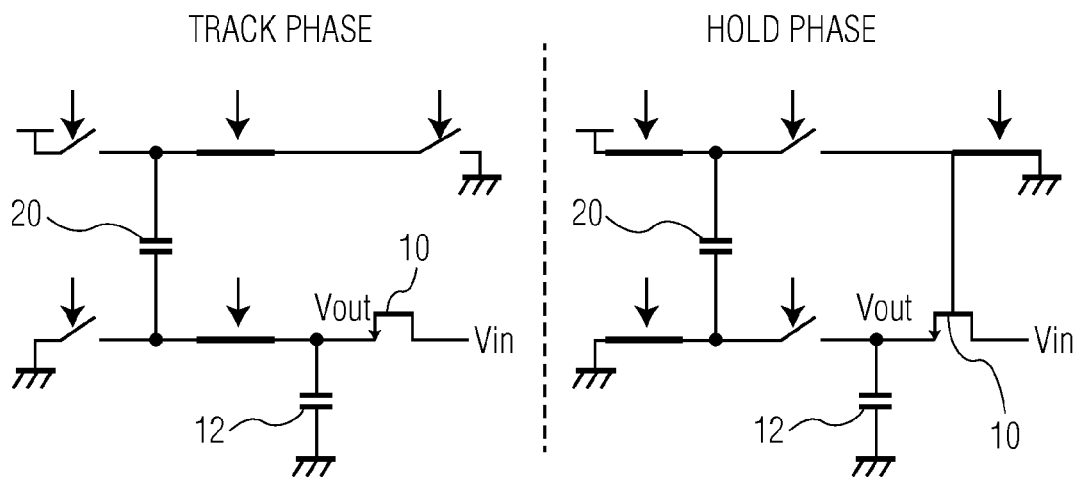
FIG. 2 is a circuit diagram which shows a second known track and hold circuit using a bootstrapping principle.
Figure 3:
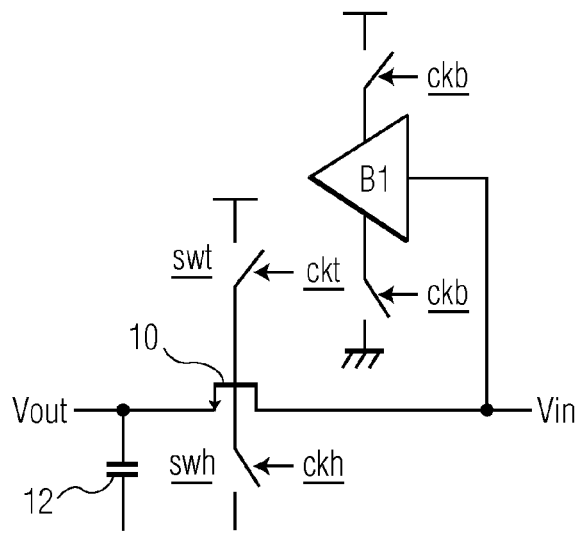
FIG. 3 is a circuit diagram which shows in schematic form the general concept underlying the circuit of the invention.

FIG. 3 shows a first example of circuit of the invention in schematic form.

The main transistor 10 and output capacitor 12 are as in the known circuits. The main transistor can for example be made as a high performance transistor (i.e. thin oxide, low voltage, minimum gate length). Such transistors offer lowest Ron for minimum parasitic capacitance. These transistors can be formed in the analogue part of a mixed analogue-digital IC.

The input voltage is provided to a buffer B1 which provides the gate voltage of the pass gate transistor 10. A switching arrangement selectively couples the gate to the buffer output for the tracking mode (using tracking switch swt) or to ground for the hold phase (using hold switch swh). The respective switch clocking signals are shown as ckt and ckh.

The Buffer B1 generates the gate voltage Vgson based on the input signal Vin.

The buffer can either be always active or it can be switched on/off using switches, for example it can be off when in the hold mode.

During the tracking phase, the Buffer B1 is active, track switch swt is closed and hold switch swh is opened. The gate voltage is pulled up to Vg=Vin+Vgson by the buffer B1, so the main transistor is closed and the output node is connected to the input node.

In the hold phase, the track switch swt is opened and hold switch swh is closed pulling down to ground the gate of the main transistor 10, so the pass gate is opened and the output node Vout is disconnected from the input signal Vin.

The switch swh can be controlled by the digital core supply without needing any translation to the higher voltage supply domain. This is not always the case for switch swt.

Switch swt can be made from a PMOS transistor, so leakage can occur, which needs to be factored into the design of the circuit.

The required switching voltage depends on the maximum input signal, the minimum digital core supply, the threshold voltage of the transistor and the acceptable leakage current. A leakage occurs when:

Vinmax−Vthpmos>Vddcore.

The track switch swt can be removed if the buffer B1 output can shorted to ground without any issue. Thus, the need for switch swt depends on the way the buffer B1 is implemented. Without switch swt, the gate of the main switch is not isolated from the buffer during the hold phase, so the output of the buffer then also needs to be pulled down (shorted to ground). This may result in a higher current, and B1 should then be designed to handle such current.

A solution to overcome this issue is to switch off the output stage of the buffer B1 during the hold phase; this can be implemented by the switches shown in FIG. 3 clocked by signal ckb. These switches can for example control the biasing circuitry of the buffer B1. This enables power saving during the hold phase and is suitable in case the hold phase duration is high compared to the sampling phase (which is for example the case for an interleaved ADC that samples one period out of many).

The control signal swb can also be used to pre-set (or re-start or pre-boost) the buffer B1 when switching from the hold phase to the track phase. This provides a pre-loading function to gain time when switching from the hold phase to the track phase.

FIG. 4 shows two examples of first implementation, in which the track switch swt is not required.

The buffer B1 is implemented by two transistors 40, 42 in series (i.e. their drain-source channels are in series) between the buffer supply voltage 46 and ground. The first transistor 40 is a current source transistor and the second transistor 42 is a source follower transistor.

The current is adjusted in order that the second transistor 42 produces the target gate-source voltage. If transistor 40 and 42 are the same design of component then Vgs(40)=Vgs(42) =Vgson in the track phase.

The node 14 between the transistors is the buffer output.

The buffer supply voltage 46 needs to be high enough to handle the maximum input voltage plus the gate-source voltage Vgson of the source follower transistor 42 plus the saturation drain-source voltage of the current source transistor 40.

The gate voltage of the transistor 40 is adjusted to provide the current that would make the source follower transistor 42 gate-source voltage equal to the target value of Vgon.

Both transistors 40,42 are shown as p-type in FIG. 4 and the main transistor is n-type.

The hold switch (swh of FIG. 3) is shown as 44 and can also be implemented as a transistor.

Figure 4A:
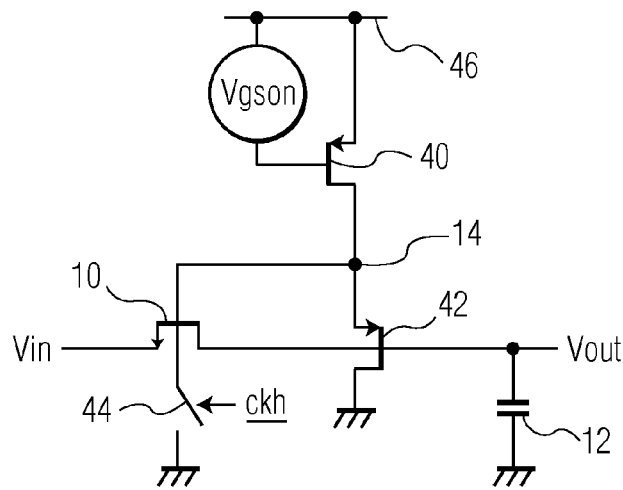
FIG. 4A is a circuit diagram which shows one version of a track and hold circuit in accordance with a first example of the invention.
Figure 4B:
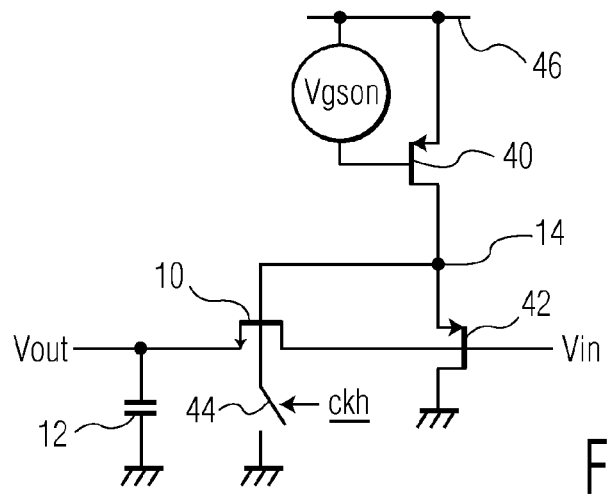
FIG. 4B is a circuit diagram which shows another version of a track and hold circuit in accordance with a first example of the invention.

In FIG. 4a, the buffer is at the output side, so that the gate voltage to the source follower transistor is defined by the output voltage, and the main transistor gate has a voltage applied which is a voltage step with respect to the output voltage. In FIG. 4b, the buffer is at the input side, so that the gate voltage to the source follower transistor is defined by the input voltage and the main transistor gate has a voltage applied which is a voltage step with respect to the input voltage.

In both cases, a voltage Vgson is applied across the gate-source of the current source transistor 40, to cause a fixed current to flow.

During the track phase, the switch 44 is open and, if transistors 40 and 42 are identical, the voltage Vgson replicates across gate-source of the main transistor 10. In particular, since the two buffer transistors pass the same current, they will settle to the same gate-source voltage, which is replicated on the main transistor. It is not essential however that the transistors 40,42 are identical.

A constant current flows from transistor 40 to ground through switch 44 during the hold phase. The switch 44 pulls down the voltage of the node 14 between transistors 40 and 42, thereby switching transistor 42 off.

The switch 44 can be controlled using the digital core supply domain without any translation and it can be made from thin oxide MOS as long as it is stacked with another transistor to avoid any reliability issues and/or breakdown issues. This stacking also enables implementation of a large size MOS switch 44 with a low parasitic capacitance at the gate of the main transistor.

There are benefits to keeping the parasitic capacitance at the gate of the main transistor 10 as low as possible:

Better sampling timing accuracy as the track to hold transition is faster; and

Better linearity as the gate voltage follows the input voltage Vin more accurately.

Current flowing from the current source transistor 40 fixes the speed of transition from the hold phase to the track phase; a higher current gives a faster transition. Hold switch 44 fixes the speed of transition from the track phase to the hold phase; a higher drive capability of the switch gives a faster transition.

The gate-source parasitic capacitance of the source follower transistor 42 plays an important role; it results from a trade-off between charge injection to the input, the hold/track and track/hold transition speed, and linearity. A high value of capacitance enables the gate voltage to copy more accurately the input voltage, Vin but with a penalty of transition speed and charge injection to the input Vin.

The circuit of the invention avoids the need for more complex bootstrapping circuitry. The main transistor 10 works at a constant gate-source voltage during the track phase, so good linearity is obtained, and a small size transistor can be used with low charge injection to the input.

There is no control signal translation, so good timing accuracy can be achieved and good transition speed. There is a high bandwidth from the input to the gate of the pass gate transistor.

A high voltage supply is needed, in particular greater than Vinmax+Vgson+Vsat(40) (where Vsat(40) is the source-drain saturation voltage of the current source transistor 40).

The circuit of FIG. 4a offers better input to output isolation but with a penalty of lower linearity, as the bandwidth from the input to the gate of pass gate transistor is lower.

FIG. 5 shows two examples of second implementation.

Instead of the node 14 between the current source and source follower transistors 40, 42 being coupled directly to the gate of the main transistor 10, the node 14 controls a further circuit, which comprises the transistor 44 between the gate of the main transistor 10 and ground (as in the previous example) and two further transistors 52, 50.

The three transistors 52, 50 and 44 are in series between the buffer high power rail 46 and ground.

Transistor 52 has been added in order to isolate the gate signal to the main transistor 10 from the input. The buffer output is connected to the gate of the transistor 52.

The source follower transistor 42 is no longer switched on and off so that charge injection back to the input during track to hold transitions and hold to track transitions is decreased. In the circuit of FIG. 4, there is charge injection to the input because of the transistor 42 switching on and off.

The gate-source voltage supplied to the current source transistor 40 is again replicated in the transistor 42 so that the node 14 is again raised above the output voltage by this amount. The gate voltage Vg of the main transistor 10 is Vout+Vgson−Vthreshold(52), so Vgs(40) should be adjusted in order to create Vgs(42)=Vgson+Vthreshold(52).

The transistor 50 is optional and provides improved reliability if the transistor 44 is made using a thin oxide.

A current source Idc determines the current through the transistors 50 and 52 during the track phase. The current source pulls current through the transistors 50,52 when the hold switch 44 is open. This maintains the transistor 52 turned on, so that the voltage on the gate of the main transistor is derived from the buffer output 14 and the gate-source voltage of the transistor 52 when delivering the current Idc. The voltage applied to the current source transistor 40 is again replicated to the main transistor (Vgson=Vgs(42))

Without current source Idc, no current would flow across the transistors 50 and 52 during the track phase. Without any current, the transistor 52 would not transfer properly the gate source voltage Vgson to the main transistor. Also, as the gate voltage of the main transistor 10 increases, the transistor 50 would switch off slowly. It would thus take a time for the gate voltage of the main transistor 10 to reach the steady state. The current source Idc thus ensures enough bandwidth to apply the gate source voltage to the main transistor 10 and enough speed to pull up the node 14.

This configuration can also be used for any other threshold voltage for the transistor 52 but with a penalty of higher supply voltage. The gate source voltages of transistors 42 and 52 are then adjusted such that Vgson(52)+Vgson(42)=Vgson.

The current source and the transistor 52 are biased in order to provide enough bandwidth from the input to the gate of the main transistor 10.

Also, the dc current guarantees that the transistor 50 is always on making the track to hold transition faster.

Compared to the implementation of FIG. 4:

There is lower charge injection to the input;

There is improved isolation from the input to the storage capacitor in the hold mode; and Faster hold to track transitions as the current of transistor 52 is not limited.

There is however additional current consumption during the hold phase because the transistor 52 is delivering current to ground.

Figure 5A:
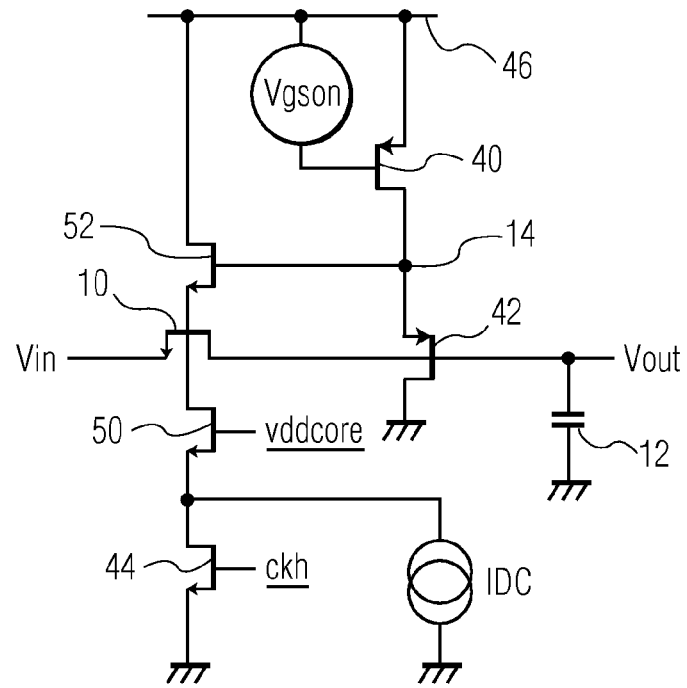
FIG. 5A is a circuit diagram which shows one versions of a track and hold circuit in accordance with a second example of the invention.
Figure 5B:
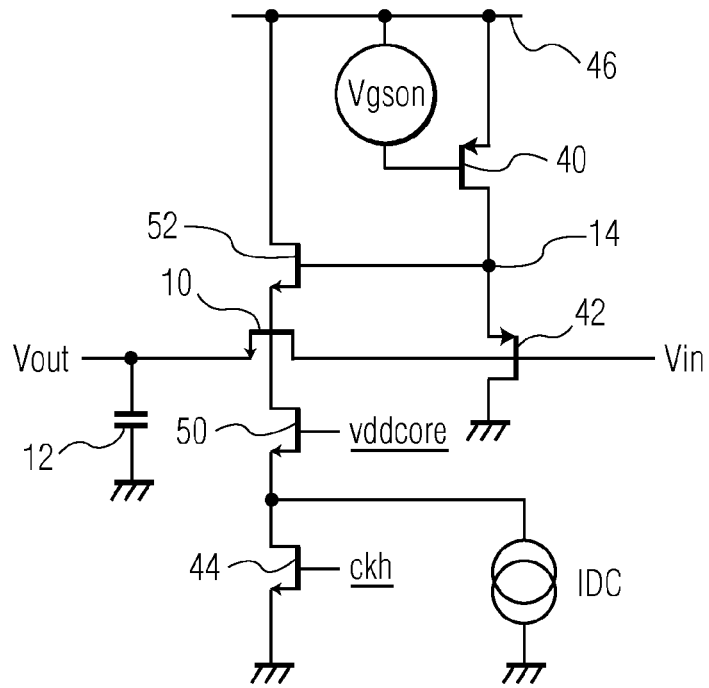
FIG. 5B is a circuit diagram which shows another version of a track and hold circuit in accordance with a second example of the invention.

As for FIGS. 4a and 4b, the input and output can be swapped, as shown in FIG. 5b.

FIGS. 6a and 6b show an embodiment which combines the operating principles of the circuits of FIG. 4 and FIG. 5. This provides a compromise between charge injection and isolation. Also, it adds the advantage that no extra current is consumed by the transistor 52 during the hold phase.

In the circuits of FIG. 6, in addition to the components of FIG. 5, there is a path to ground from the node 14 with two series transistors.

A second transistor 50' is turned on by the digital core voltage and a second hold switch 44' is controlled synchronously with the first hold switch 44. This parallel branch means that the second transistor 42 is turned off during the hold phase, but the transition speed is still improved by the main branch 52, 50, 44 which determines the switching speed of the main transistor 10.

The current source transistor 40 could also be switched off during the hold phase since the current source Idc instead enables the gate of the main transistor to be pulled to ground. The penalty is that it will take more time to switch fully on during the track phase.

A multiplexer circuit can be implemented by combining two of the track and hold circuits, and sharing the common circuit elements. This is particularly suitable for the examples of FIGS. 4a, 5a and 6a where the buffer is connected to the output side.

The example of FIG. 4a has relatively high speed, some injection, a medium degree of isolation but a power penalty.

The example of FIG. 6a is relatively low speed, but has high isolation, low injection and low power consumption.

The example of FIG. 5a is a compromise between the designs of FIGS. 4a and 6a.

In a differential configuration, switch 44 could be shared making charge injection matched at the time of transition from track phase to hold phase.

For a differential implementation, two track and hold circuits that handle both positive and negative signals switch from track to hold at exactly the same time. This is manageable by design making the clock path common as far as possible. For example transistor 44 can be common.

In the more general case of an interleaving ADC, with each ADC unit having its own track and hold circuit, the same issue arises in connection with sampling time precision; all sampling times should perfectly equidistant. This can be managed either by some calibration mechanism or by design. Again, the clock tree can be shared as much as possible between all track and hold circuits. For example, if there are many track and hold circuits to match in timing, transistor 44 can be shared between all the track and hold circuits, and for each track and hold circuit an extra transistor in parallel can be used that can force the hold phase during all other clock cycles.

Preload circuitry can be added to the gate of the main transistor 10 to help switching from the hold phase to the track phase. To implement a preload, a circuit block can be connected to node 14 and controlled by a clock. The purpose of the pre-load block is to help pull-up the node 14 during hold to track phase transition.

The invention is of particular interest for high speed, high performance analog to digital converters, or for full spectrum receivers (FSRs).

In some known implementations, the bulk voltage of the main transistor is also driven using a buffer in order to preventing loading the input. In such situations, the threshold modulation as a function of the input signal is avoided and linearity is improved. The same approach can be used in the circuits described above.

In the circuits shown, various combinations of NMOS and PMOS transistors are shown. The transistors can all be implemented as CMOS transistors, but other technologies can be used. For example, the circuit can be implemented on BiC- Mos technology. Transistors 50 and/or 52 could be NPN transistors. If high performance PNP devices are available, transistor 42 could also be a PNP device.

The transistors 40,42 can be implemented with discrete components or fully integrated.

By way of example, the voltage of high rail 46 may be around 2.5V (i.e. greater than 2V), Vgson may be around 1V, and the digital core supply may be around 1.2V (i.e. less than 2V). A 65 nm process can be used, and the input voltage may be +/−300 mV around 400 mV.

The invention can be used in any circuit which makes use of track and hold functionality.

By way of example, FIG. 7*a* shows a multiplexer circuit. A set of (analogue) inputs is coupled to a multiplexer element 70 by means of respective track and hold circuits. The track and hold circuits are controlled by sample enable lines. The track and hold circuits hold the signals to the multiplexer while it scans through its channels, under the control of a channel select line. This circuit can for example be used to enable ND conversion of a set of analogue inputs using a shared A/D converter at the output of the multiplexer element.

In FIG. 7*a*, the track and hold circuits may each be complete circuits as described above. However, the buffers may instead be removed from each track and hold circuit block and a single buffer circuit can be used, for example at the output of the multiplexer, in the same manner as in FIG. 4*a* where the buffer is connected at the output side. In this case, the track and hold block is switched for both the track and hold phases. At the limit, each track and hold block can comprise only the main transistor and the control switches swt, swh.

FIG. 7*b* shows a single channel A/D converter, in which the input to the converter is held by a track and hold circuit while the conversion process takes place.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A track and hold circuit, comprising:
   a main transistor between an input and an output of the circuit, wherein the main transistor is part of an integrated circuit supplied by a first set of voltage rails which form a digital core supply;
   a storage capacitor for storing the output voltage during a hold phase during which the main transistor is turned off; and
   a buffer circuit for generating a gate voltage for turning on the main transistor during a track phase, wherein the buffer circuit includes at least one transistor and is adapted to derive a gate voltage based on one of the input voltage and the output voltage of the circuit and a voltage step with respect to the input voltage or the output voltage, wherein the buffer circuit is supplied by a second set of voltage rails which form an analogue supply and with a greater voltage swing than the first set of voltage rails.

2. A track and hold circuit, comprising:
   a main transistor between an input and an output of the circuit, wherein the main transistor is part of an integrated circuit supplied by a first set of voltage rails which form a digital core supply;
   a storage capacitor for storing the output voltage during a hold phase during which the main transistor is turned off; and
   a buffer circuit for generating a gate voltage for turning on the main transistor during a track phase, wherein the buffer circuit is adapted to derive a gate voltage based on one of the input voltage and the output voltage of the circuit and a voltage step with respect to the input voltage or the output voltage, wherein the buffer circuit is supplied by a second set of voltage rails which form an analogue supply and with a greater voltage swing than the first set of voltage rails, wherein the buffer comprises a first, current source transistor, and a second transistor in series between voltage rails of the second set, wherein a node between the first and second transistors controls a gate voltage of the main transistor.

3. A circuit as claimed in claim 2, wherein the first transistor gate-source voltage is derived from the high voltage rail of the second set and the second transistor gate is connected to one of the input and the output.

4. A circuit as claimed in claim 3, wherein the node between the first and second transistors is connected to the gate of the main transistor.

5. A circuit as claimed in claim 4, further comprising a hold transistor between the gate of the main transistor and ground for implementing the hold phase.

6. A circuit as claimed in claim 3, wherein the node between the first and second transistors is connected to a control transistor's gate, wherein the control transistor is connected between a voltage rail of the second set of voltage rails and the gate of the main transistor.

7. A circuit as claimed in claim 6, further comprising a hold transistor between the gate of the main transistor and ground for implementing the hold phase.

8. A circuit as claimed in claim 7, further comprising a current source for driving a current through the control transistor.

9. A circuit as claimed in claim 6, further comprising a second hold transistor between the node and ground and switched synchronously with the hold transistor.

10. A circuit as claimed in claim 2, wherein the second set of voltages has a voltage swing at least equal to a sum of a maximum input voltage, the voltage step and a saturation voltage of the first current source transistor.

11. An analogue to digital converter circuit comprising a track and hold circuit as claimed in claim 2, and a conversion circuit at an output side of the track and hold circuit.

12. A multiplexer circuit comprising:
   a multiplexer element; and
   a plurality of track and hold circuits, each as claimed in claim 1, and each between a respective signal input and the multiplexer element.

13. A method of controlling a track and hold circuit which comprises a main transistor between an input and an output of the circuit and which is part of an integrated circuit supplied by a first set of voltage rails which form a digital core supply, the method comprising: generating a gate voltage for turning on the main transistor during a track phase using a buffer circuit that includes at least one transistor, wherein the buffer circuit is controlled to derive a gate voltage based on one of the input voltage and the output voltage of the circuit and a voltage step with respect to the input voltage or the output voltage, wherein the buffer circuit is supplied by a second set of voltage rails which form an analogue supply with a greater voltage swing than the first set of voltage rails.

14. A method as claimed in claim 13, wherein the track and hold circuit is used within one of a multiplexer circuit and an analogue to digital conversion circuit.

\* \* \* \* \*